NOISE REJECTION CIRCUITS FOR PARTICLE COUNTERS

Filed Jan. 14, 1969 2 Sheets-Sheet 1

INVENTORS
HUGH MALCOLM OGLE
KENNETH L. PEKAREK
BY
Flehr, Hohbach, Test,
Albritton & Herbert
Attorneys

NOISE REJECTION CIRCUITS FOR PARTICLE COUNTERS

Filed Jan. 14, 1969 2 Sheets-Sheet 2

INVENTORS
HUGH MALCOLM OGLE
KENNETH L. PEKAREK
BY Fehr, Hohlbach, Test, Albritton & Herbert
Attorneys United States Patent Office
3,548,206
Patented Dec. 15, 1970

3,548,206
NOISE REJECTION CIRCUITS FOR PARTICLE COUNTERS

Hugh Malcolm Ogle, Palo Alto, and Kenneth L. Pekarek, Belmont, Calif., assignors to Royco Instruments, Inc., Menlo Park, Calif., a corporation of California Filed Jan. 14, 1969, Ser. No. 790,940
Int. Cl. H03k 5/20
U.S. Cl. 307—235 5 Claims

ABSTRACT OF THE DISCLOSURE

A noise rejection gate normally shorts out a signal path from preamplifier and amplifier circuits to the counting circuits of a particle counter. Whenever the instantaneous level of signal input exceeds the average noise by a predetermined amount, the gate is opened and a data pulse on the input signal is counted. The gate is reset by the trailing edge of the data pulse, by the count pulse or automatically after a short time lapse. Detailed circuits for performing the above are disclosed.

BACKGROUND OF THE INVENTION

This invention relates to particle counters and in particular to noise rejection circuits for selectively discriminating against noise and preventing false counting due to noise.

Optical particle counters are susceptible to erratic counting on inherent noise resulting from various sources such as signals from the passage of particles smaller than that which the counter is designed to sense, photomultiplier tube noise, optical light leakage, and noisy electronic components. Furthermore, there is a residual level of radio frequency interference caused by equipment in the vicinity. All of these factors tend to cause the overall noise level to vary over a period of time. Such noise cannot be applied to counting circuits because such circuits would count and be triggered by the noise component. Conventional squelch circuits are not particularly useful since the noise level is continually varying and may exceed the squelch threshold at which point the accumulated information would be totally swamped by excessive background count. A typical situation of this type occurs in clean rooms where there may be as little as 100 particles per cubic foot. If one cubic foot of air were examined per minute, you would get less than a hundred counts per minute. At this counting level any noise bursts or background level due to other causes would be very significant and, even though only counted for a short duration, would still completely mask the counts due to particles.

Suggestions for utilizing fixed squelch level have not been found particularly useful since most squelch levels automatically discard information in an entire channel in order to assure absence of false counting on noise.

SUMMARY OF THE INVENTION AND OBJECTS

In accordance with the present invention, a particularly effective control is obtained over the sensitivity of the counting circuits by providing a noise rejection circuitry having a variable threshold level which automatically adjusts itself to a turn-on level which is slightly higher than the noise in the system. The incoming signal voltage and a turn-on voltage are compared and whenever the signal voltage exceeds a predetermined value, a gate is opened in the signal circuit to permit the counting of such input pulses. The noise rejection circuitry of the present invention provides a well defined output control pulse to the gate whenever a data pulse is sensed which is above the variable threshold level. As the noise level varies, turn-on level is also varied so that pulses having an amplitude below a particular level together with noise will be rejected. Accordingly, it is a general object of the present invention to provide a noise rejection circuitry for use in particle counters which permits the selective discrimination against counting on noise or on signals of an amplitude of the order of the noise to thereby eliminate false counts from these causes and which positively passes all signals above a variable threshold level slightly greater than noise.

Another object of the invention is to provide noise rejection circuitry of the above character utilizing a gate which controls the flow of data pulses between the particle sensor and the counting circuits. The gate opens when it receives suitable control signal and closes and resets upon either receiving the end of an incoming signal, positive count information, or if neither of the above occur, it closes and resets automatically.

Another object of the invention is to provide noise rejection circuitry of the above character which achieves a high signal-to-noise ratio.

The above objects and features of the invention are achieved in apparatus for counting events characterized by an electrical signal consisting of pulses of various width and amplitude in the presence of noise. The apparatus is provided with a counter having at least a portion thereof sensitive to pulses of the strength of the same order of magnitude as noise. A noise-to-signal comparator and amplifier is provided for developing a first signal representative of the average level of the input signal and for comparing it with the input signal itself and for generating an output signal which exceeds the first signal by a predetermined amount. The control pulse is used to open a noise reject gate in the signal path to the counting circuits thereby permitting that signal to be counted. The gate is closed by sensing the information contained at the trailing edge of the control pulse or by information from the counting circuits that a count has been obtained. If the gate receives no closing information from the other circuits, it is designed to reset itself closed after a short interval.

These and other features and objects of the invention will become apparent from the following description when taken in conjunction with the accompanying drawings.

DETAILED DESCRIPTION OF THE PREFERRED EMBODIMENT

Figures 1, 2, 3:
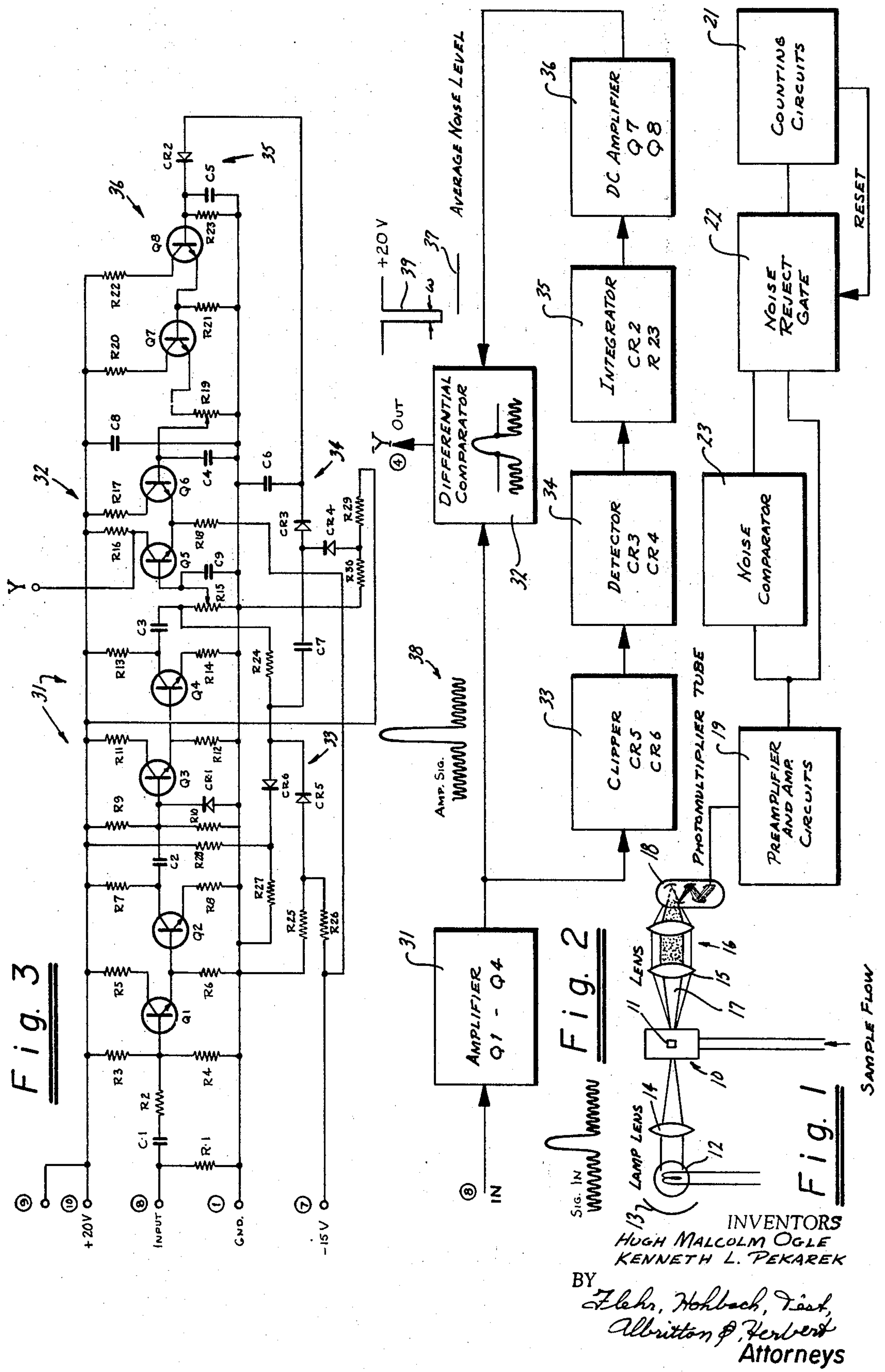
FIG. 1 is a block diagram of a particle counter incorporating noise rejection circuits in accordance with the present invention.
FIG. 2 is a detailed block diagram of the noise comparator of FIG. 1.
FIG. 3 is a detailer circuit diagram of the noise comparator of FIG. 2.

Referring to FIG. 1, there is shown a block diagram of a particle counter or monitor constructed in accordance with the present invention. Samples of fluid containing the particles to be counted are flowed by a suitable piping system 10 through a volume 11 in which particles are sensed by their action in scattering light. Typical of such fluids are aerosols, clean room atmospheres, and the like. Suitable illuminating lamp 12, reflector 13, and condensing optics 14 serve to concentrate light from the lamp and pass it through volume 11 from which it is collected by lens 15. A forward scatter detecting system 16 blocks out and absorbs the main light beam 17 (the direct light rays) but gathers light scattered into a solid angle surrounding the main beam and focuses such scattered light onto a suitable light sensor such as a photomultiplier tube 18. The photomultiplier tube is connected to preamplifier and amplifier circuits 19 as well as power supply circuits (not shown) so that each pulse of light impinging on its cathode is transformed into an electronic or emission pulse signal which is cascade multiplied in the tube and used to drive the input of preamplifier and amplifier circuits 19. The signal output from the preamplifier and amplifier circuits is selectively applied to suitable counting circuitry 21 by a noise reject gate 22 which stops the passage of the signal by shorting the signal out or opens such short to permit the signal to proceed. Gate 22 is operated and controlled by a noise comparator 23 which samples the input signal and provides a well defined output control pulse to the noise reject gate 22 whenever an input data pulse is sensed which is above a predetermined threshold level. The threshold level is automatically maintained close to but above noise level by comparing the average level of noise in the system with the instantaneous value of an incoming signal. Assuming that the input signal contains a data pulse, its instantaneous value shifts and exceeds the average noise level. On this event, a gate control pulse is generated within the circuitry of the comparator. The gate is closed by a reset circuit which responds both to the trailing edge of the input signal pulse and to a count pulse generated within the count circuit. If neither occur, the reset circuit automatically recycles to a closed state after a short time.

Referring to FIGS. 2 and 3, the comparator 23 of the invention is shown in more detailed block diagram form and in detailed circuit form, respectively. The input of the amplifier consists of an amplifying stage 31 consisting of Q1, Q2, Q3 and Q4 which amplify the composite input signal and apply it to the base of Q5 forming a part of differential comparator circuit 32 to be more fully described. CR1 is a clipper diode which protects transistor Q3 from large negative pulses. The input signal voltage is developed across R15 and is taken through to a clipping network 33 consisting of diodes CR5 and CR6 which are back biased by resistors R25 and R26, respectively, so that any voltage over 3.2 or under —3.2 volts is passed to ground through the clipping diodes. This effectively prevents large amplitude signals from being included in determining the average noise or turn-on levels. The remaining signal from the clipping network is then passed to a detector 34 consisting of CR3 and CR4 which are connected as a voltage doubler. The detected signal is applied to an integrating circuit 35 consisting of CR2, R23 and C5, the average level of which is sensed by DC amplifier 36 including Q7 and Q8. Capacitor C5 is a storage capacitor which determines the response characteristics of the DC amplifier and the time interval over which the input noise level is effectively taken. The average noise level 37 appears as the emitter output of Q7 and is developed across potentiometer R19 from the adjustable tap of which it is connected to the base of Q6.

Transistors Q5 and Q6 and associated components are connected as an emitter coupled trigger which serves as a differential amplitude comparator 32, the average noise level 37 being taken from the tap of potentiometer R19 to the control input or base of Q6 and the composite noise and data signal 38 being taken from the adjustable tap of potentiometer R15 to the control input or base of Q5. As the noise level in the composite signal rises, the output of Q7 will increase forward bias on Q6 because of the varying current drawn through resistor R18. In this way, the back bias is effectively increased with respect to the emitter of Q5 and an input signal larger than the noise level is required in order to generate an output. An incoming signal pulse 38 appearing at the base of Q5, which is above noise level, will forward bias Q5 and drive it into conduction such that the power supply voltage of 20 volts appearing on one side of the resistor R16 is dropped to a level approaching a midpoint between that and the emitter voltage established from the minus voltage supply. Adjustment of the tap of potentiometer R19 sets the average noise level to which the comparator is generally referrenced, while adjustment of the tap of potentiometer R15 establishes the relative magnitude of the input signal which causes the differential comparator to respond with an output pulse. Thus, a negative going output control pulse 39 is developed at the collector of transistor Q5 and is directed to pin 4 at approximately 18 volts in magnitude. In general, the width of the output control pulse, *w*, is controlled by and is the same as that of the input pulse, but its rise and fall times are determined by the characteristics of the trigger and are made quite fast.

Figures 4, 5:
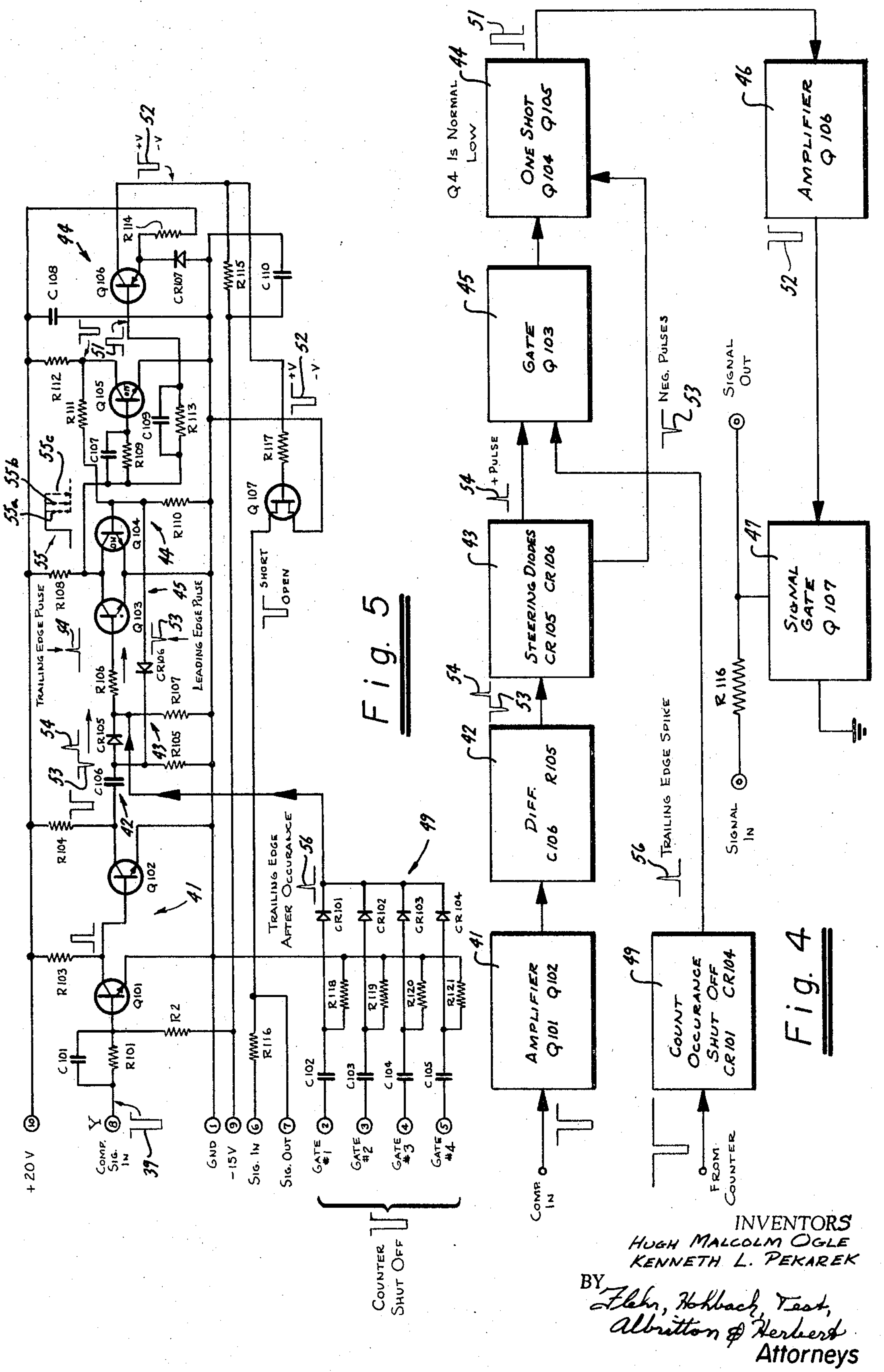
FIG. 4 is a detailed block diagram of the noise reject gate of FIG. 1.
FIG. 5 is a detailed circuit diagram of the noise reject gate of FIG. 4.

The output of the noise comparator 23 consists of control pulse 39 as previously described and is applied to the input of the noise gate circuit illustrated in FIGS. 4 and 5. The gate 22 responds to input control pulses 39 and serves to gate or control the flow of data pulses from the amplifier circuits 19 to the counting circuits 21. Thus, gate 22 opens in response to the leading edge of an input pulse 39 and closes on the trailing edge of an input pulse. The gate also closes or resets in response to the reception of a signal from the counting circuits that a count has been made. Failing either of the above, the gate automatically closes after a predetermined period of time.

The input control signal 39 is applied to an amplifier circuit 41 including transistors Q101 and Q102. These transistors constitute a pulse shaper and amplifier and also serve to speed up the rise time of the incoming pulse. The collector output of Q102 is passed through a differentiator 42 consisting of C106 and R105 and then to a diode steering circuit 43 including diodes CR105 and CR106 to an appropriate input of a one-shot or astable multivibrator circuit 44 including transistors Q104 and Q105 and associated circuitry. Transistor Q103 serves as a turn-off gate 45, as will be presently described. The output pulse 51 of the multivibrator circuit is connected to an amplifier 46 including transistor Q106, the output of which is applied to a signal gate 47 including FET Q107 having source and drain connection placed across the signal path and ground. In its quiescent state, Q107 shorts the signal to ground and so remains as long as Q106 remains ON. However, when Q106 is turned OFF and delivers a negative, square pulse 52 to the gate of Q107, it also turns it off to thereby open the gate so that the signal appearing on the signal line is passed through to the counting circuits.

As indicated, the high pass ac differentiating circuit 42 consisting of capacitor C106 and R105 serves to divide the incoming square control pulse 39 into sharp impulses such that the leading edge of pulse 39 becomes a negative impulse or spike 53 and the trailing edge of the pulse becomes a positive impulse or spike 54. Steering diode CR106 permits negative impulses 53 to pass to the base of normally-on transistor Q104. This negative impulse cuts it off and switches the multivibrator output from Zener voltage of CR107 down to about 15 volts. This is shown by reference to the collector of Q104 which is tied directly to the base of transistor Q106 through R113 and C109. The voltage waveform 55 at the collector abruptly rises as transistor Q104 is turned off. Simultaneously with Q104 being turned off, normally-off transistor Q105 is turned on by the application of the same positive-going pulse 55 to its base. To restate, the circuitry differentiates a negative going input pulse and applies the negative impulse from the leading edge to a multivibrator which shifts it to the astable state and causes the application of a negative turn-off voltage to the gate of Q107. This opens the short circuit across the signal path to the counter and permits the signal data to proceed.

Steering diodes CR101 through CR104 are connected in parallel from each of the several counting circuits.

Pulses from any of the counting circuits arriving at gates 1 through 4 are differentiated by the counter shut-off circuits 49 and the trailing edge positive impulse 56 that is derived and passed through diode CR105 to the base of gate transistor Q103. This simultaneously turns on both of Q103 and Q104 and restores the multivibrator to its quiescent state, the collector voltage pulse (55*a*) dropping back to ground level.

Alternatively, a positive reset pulse can be only derived from the trailing edge of the input control which is seen at 54 and which is available to pass through CR105 and cause a drop (55*b*) in the voltage at the collector of Q104. In the event that none of the previous positive pulses are available to cause multivibrator to return to its normal state, the values of the components in the multivibrator are selected so that it automatically shifts back to its normal state with the collector voltage dropping to ground level, as indicated at 55*c*, after a predetermined interval.

The control pulse developed in the noise comparator and the gate circuits, which turns off the shunt transistor Q107, is very short in duration in comparison to the data pulse generated by the photomultiplier tube. Likewise, the count pulse developed by the counting circuits is generated in a very short time (after shunt transistor Q107 turns off) in comparison to the duration of the data pulse. Therefore, the count pulse is fed back from the output of the gate trigger into the gate circuit through diodes CR101 or CR102. From these diodes the count pulse is connected to the base of transistor Q103 to activate the one-shot multivibrator and the amplifier 41 to turn on the gate transistor Q107 again, restoring its quiescent (gate closed) state.

The complete circuit diagram of the noise comparator and reject gate constructed in accordance with the above is shown in FIGS. 3 and 5 and the values of the values of the components in FIGS. 3 and 5 were as follows. The arrows generally indicate those groups of circuits components performing the functions set forth in the block diagrams of FIGS. 1 through 3.

NOISE COMPARATOR

Transistors:

| | |
|---|---|
| **Q1–Q8** | 2N1711 |

Resistors (in ohms):

| | |
|---|---|
| **R1** | 10K |
| **R2** | 200 |
| **R3** | 47K |
| **R4** | 5.1K |
| **R5** | 100 |
| **R6** | 47K |
| **R7** | 1.3K |
| **R8** | 200 |
| **R9** | 47K |
| **R10** | 5.1K |
| **R11** | 100 |
| **R12** | 47K |
| **R13** | 1.3K |
| **R14** | 68 |
| **R15** | 10K |
| **R16** | 10K |
| **R17** | 100 |
| **R18** | 7.5K |
| **R19** | 1K |
| **R20** | 100 |
| **R21** | 100K |
| **R22** | 100 |
| **R23** | 470K |
| **R24** | 4.7K |
| **R25** | 240 |
| **R26** | 1.3K |
| **R27** | 240 |
| **R28** | 1.8K |
| **R29** | 3.6K |
| **R30** | 1.2K |

Capacitors:

| | $\mu$f. |
|---|---|
| **C1** | 6.8 |
| **C2** | 6.8 |
| **C3** | 6.8 |
| **C4** | .001 |
| **C5** | 1 |
| **C6** | 6.8 |
| **C7** | 6.8 |
| **C8** | 100 |
| **C9** | .001 |

Diodes:

| | |
|---|---|
| **CR1–CR6** | 1N459 |

NOISE REJECT GATE

Transistors:

| | |
|---|---|
| **Q101–Q105** | EN1613 |

Resistors (in ohms):

| | |
|---|---|
| **R101** | 27K |
| **R102** | 43K |
| **R103** | 10K |
| **R104** | 2K |
| **R105** | 2K |
| **R106** | 4.7K |
| **R107** | 68K |
| **R108** | 2K |
| **R109** | 15K |
| **R110** | 2K |
| **R111** | 15K |
| **R112** | 2K |
| **R113** | 30K |
| **R114** | 510 |
| **R115** | 3.3K |
| **R116** | 2K |
| **R117** | 10K |
| **R118** | 100K |
| **R119** | 100K |
| **R120** | 100K |
| **R121** | 100K |

Capacitors:

C101—330pfd.
C102—.001$\mu$fd.
C103—.001$\mu$fd.
C104—.001$\mu$fd.
C105—.001$\mu$fd.
C106—220pfd.
C107—150pfd.
C108—6.8$\mu$fd.
C109—150pfd.
C110—6.8$\mu$fd.

Diodes:

| | |
|---|---|
| **CR101–CR106** | IN459 |

The above described particle counter circuitry has been found to operate very satisfactorily, permitting the reliable counting of events having a signal amplitude very close to the noise level. Simultaneously, it has effectively eliminated false counts due to noise and assured maximum use of the equipment as the noise level varies. It is believed that the noise rejection circuitry of the present invention would be applicable to a variety of apparatus for counting events characterized by a signal including data pulses in the presence of noise of comparable amplitude. Accordingly, many modifications and varying embodiments of the present invention will suggest themselves to those skilled in the art to which it obtains without departing from the spirit and scope of the invention. It is to be understood, therefore, that the disclosures and descriptions herein are to be taken in an illustrative sense and not in a limiting sense.

We claim:

1. In apparatus for counting events characterized by a signal consisting of pulses of various width and amplitude in the presence of noise, a counter having at least a portion thereof sensitive to data pulses having strengths of the same order of magnitude as the noise, means for developing a first signal representative of the average level of said input signal, means for comparing said first signal with the input signal and for generating an output control pulse whenever the instantaneous value of the input signal exceeds said first signal by a predetermined amount, a signal gate disposed before the input to said counter, said signal gate being responsive to and controlled by said control pulse to permit data pulses to pass whenever said control pulse is present.

2. Apparatus as in claim 1 further including means for limiting the portion of the input signal fed to said first signal developing means so that large value pulses are discounted from the information used to establish said first signal.

3. Apparatus as in claim 1 in which said differential comparator is an emitter coupled trigger, having control inputs connected to average noise level and input signal respectively.

4. Apparatus as in claim 1 in which said signal gate consists of a differentiator for receiving said control pulse and for producing electrical impulses in response to the leading and trailing edge of said pulse, a multivibrator having stable and quasistable states with a time constant of return to the stable state longer than the expected time values of said incoming pulses, means for receiving said leading and trailing edge impulses and for steering them to portions of said multivibrator such that impulses from the leading edge shift said multivibrator to the quasistable state and impulses from the trailing edge shift said multivibrator back to the stable state, means connecting the output of said multivibrator to said signal gate such that the stable value of said multivibrator turns said gate off and the quasistable value is operative to turn said gate on.

5. Apparatus as in claim 4 further including a reset circuit for returning said multivibrator to said stable off state, said reset circuit being responsive to the trailing edge of either the input signal or the count signal.

References Cited

UNITED STATES PATENTS

| | | | |
|---|---|---|---|
| 3,094,665 | 6/1963 | Wildman ---------- | 328—149X |
| 3,128,435 | 4/1964 | Mleczko et al. ------ | 328—115 |
| 3,166,678 | 1/1965 | Fleshman, Jr., et al. -- | 307—235 |
| 3,387,222 | 6/1968 | Hellwarth et al. ---- | 307—235X |

STANLEY D. MILLER, Jr., Primary Examiner

U.S. Cl. X.R.

307—231, 237, 264; 328—116, 147, 163, 165